United States Patent [19]

Spillman, Jr.

[11] Patent Number: 5,412,469
[45] Date of Patent: May 2, 1995

[54] OPTICAL SPECTRUM ANALYZER AND ENCODER USING A MODULATED PHASE GRATING WHEREIN SAID GRATING DIFFRACTS THE WAVELENGTH AS A FUNCTION OF THE MAGNETIC FIELD

[75] Inventor: William B. Spillman, Jr., Charlotte, Vt.

[73] Assignee: Simmonds Precision Products, Inc., Akron, Ohio

[21] Appl. No.: 976,605

[22] Filed: Nov. 16, 1992

[51] Int. Cl.⁶ .............................................. G01J 3/28
[52] U.S. Cl. .................................... 356/328; 356/334; 356/308; 250/227.23; 324/244.1
[58] Field of Search ............... 356/345, 354, 308, 334, 356/328; 324/96, 244.1, 260; 250/227.23

[56] References Cited

U.S. PATENT DOCUMENTS

| | | |
|---|---|---|
| 3,752,563 | 8/1973 | Torok et al. |
| 4,064,453 | 12/1977 | Haas |
| 4,082,424 | 4/1978 | Sauter |
| 4,115,747 | 9/1978 | Sato et al. |
| 4,148,556 | 4/1979 | Sauter et al. |
| 4,168,107 | 9/1979 | Sauter |
| 4,195,261 | 3/1980 | Zwingman |
| 4,228,473 | 10/1980 | Himuro et al. |
| 4,243,300 | 1/1981 | Richards et al. |
| 4,355,864 | 10/1982 | Soret |
| 4,398,798 | 8/1983 | Krawczak et al. |
| 4,435,041 | 5/1984 | Torok et al. |
| 4,529,875 | 7/1985 | Brogardh et al. |
| 4,695,796 | 9/1987 | Omet et al. ............... 324/244.1 |
| 4,812,767 | 3/1989 | Taketomi ............... 324/244.1 |
| 4,896,103 | 1/1990 | Shimanuki et al. ............... 324/244.1 |
| 4,952,014 | 8/1990 | Lieberman et al. |
| 5,038,102 | 8/1991 | Glasheen |
| 5,192,862 | 3/1993 | Rudd, III ............... 250/227.21 |

FOREIGN PATENT DOCUMENTS

0374022A1 12/1989 European Pat. Off.
0501726A2 2/1992 European Pat. Off.
WO8705762 9/1987 WIPO.

OTHER PUBLICATIONS

Applied Optics, vol. 20 No. 20/15 Oct. 1981/ Sauter et al. "Alterable Grating Fiber-optic Switch".
Journ. App. Phys., vol. 42, No. 1/15 Mar. 1971/Johansen et al. "Variation of Stripe-Domain Spacing ...".
IEEE, vol. MAG12, No. 4/Jul./Scott et al. "Magnetooptic ... Garnets".
IEEE, vol. MAG6, No. 3/Sep. 1970/Haskal, "Polarization & Efficiency ...".
Sementsov, "Diffraction of light at a strip domain structure. Quadratic magnetooptic effect," Sep. 1980.
Ravlik et al., "Thermal Indicators Based On Permalloy Films With Banded Domain Structure For Measurement And Display Of Temperature Fields," Instruments & Experimental Techniques, May–Jun. 1988, No. 3, Part 2.

*Primary Examiner*—F. L. Evans
*Assistant Examiner*—Robert Kim
*Attorney, Agent, or Firm*—Leonard L. Lewis; William E. Zitelli

[57] ABSTRACT

An apparatus and method of wavelength detection and parameter sensing uses a variable magnetic field applied to a Faraday effect thin magnetizable film to perform spectral analysis based on detected intensity distribution of diffracted light for known magnetic field strengths. The strength of the applied magnetic field can also be varied by change in a physical parameter relative to a fixed magnet in a magnetic circuit which generates a magnetic field about the grating to produce diffracted wavelengths which correspond to the parameter which influences the magnetic circuit.

32 Claims, 2 Drawing Sheets

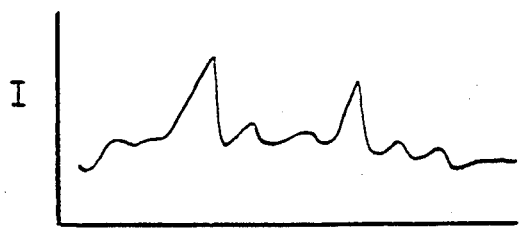
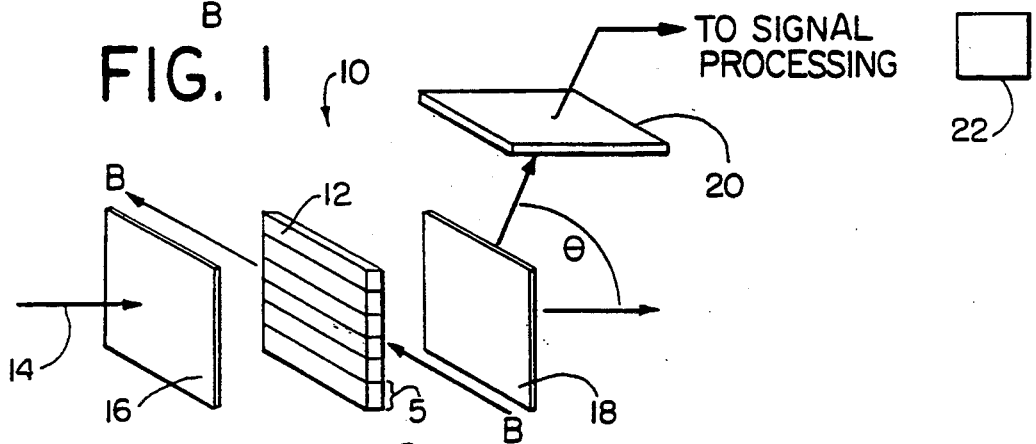
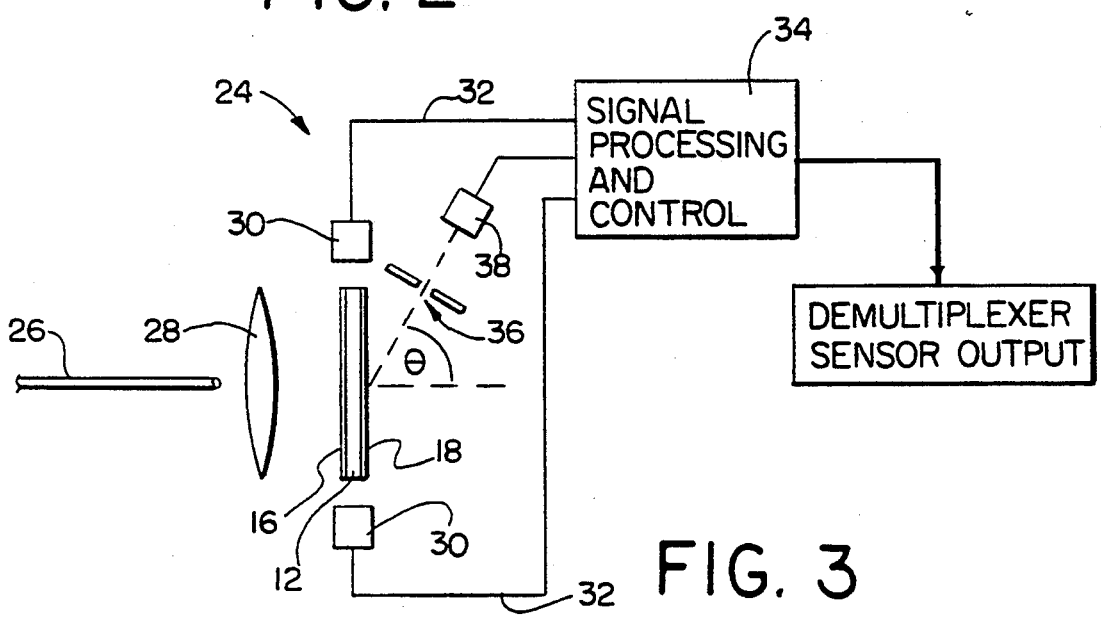
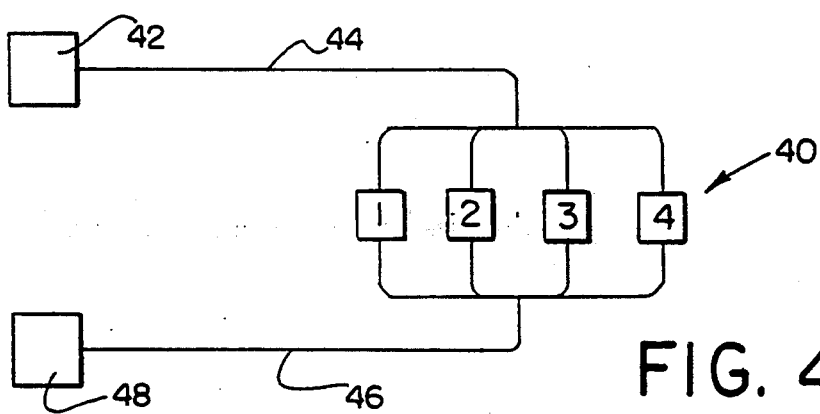

OPTICAL SPECTRUM ANALYZER AND ENCODER USING A MODULATED PHASE GRATING WHEREIN SAID GRATING DIFFRACTS THE WAVELENGTH AS A FUNCTION OF THE MAGNETIC FIELD

FIELD OF THE INVENTION

The present invention relates generally to optical wavelength analysis and, more particularly, to determination of physical properties and parameters by spectral analysis and encoding.

BACKGROUND OF THE INVENTION

Thin magnetizable film having striped domains has been used as magneto-optic diffraction gratings. Variation of the separation and width of striped domains of thin-film magnetizable gratings and the resultant angle of diffraction by the Kerr and Faraday effects through control of an fixed magnetic field is also known. The use of such gratings as optical modulators, switches and multiplexers in integrated optical devices has also been disclosed. Such uses are limited, however, to controlling the angle of diffraction of incident light by setting an applied magnetic field at a fixed value using fixed wavelength signals.

Real time spectral analysis is presently carried out in a number of ways, one of which is to collimate the unknown spectral distribution, transmit it through or reflect it from a mechanical diffraction grating to separate the spectral components according to a first order angle and detect the relative spectral intensities via a charge coupled device (CCD) photodetector array. Another method which is used in chemical spectroscopic analysis replaces the expensive CCD photodetector array with a simple photodetector and rotates the diffraction grating mechanically with the spectral component incident on the detector. The detected light is thereby directly related to the amount of rotation of the grating.

The expense of CCD-based systems, and the limited speed and mechanical nature of such chemical spectroscopy systems leaves a need for a nonmechanical electrically controllable spectral analyzer which serves as a detector for one or a multiplexed number of wavelength-encoded sensors. Wavelength-encoded optical sensors which rely upon mechanical diffraction gratings also have inherent disadvantages of size and weight and typically require accompanying optics which make practical applications difficult.

SUMMARY OF THE INVENTION

The present invention is of apparatus and methods which use a thin-film magnetizable diffraction grating having striped domains for spectral analysis and optical sensing using wavelength-encoded signals. The invention utilizes the novel concept of functionally correlating a characteristic such as intensity or wavelength of light diffracted from a grating to a variable magnetic field characteristic which controls the period of the grating. In this manner, the energy of light diffracted from such gratings is quantifiable in terms of the magnetic field applied to the grating. The invention makes possible construction of a spectral analyzer and/or optical sensor which is lightweight and compact and has excellent immunity from electromagnetic interference because the parametric information of interest is light encoded, and the transducer electronics for converting the modulated light characteristic to electronic signals can be located remote from the photodetection location.

In accordance with one aspect of the invention, an optical wavelength detector and method is provided for detecting wavelengths of a spectral signal, the detector comprising means for controlling a variable magnetic field, a magnetizable phase grating having a grating period which is a function of the magnetic field, and means for radiating the grating with a spectral signal as the magnetic field is varied.

In accordance with another aspect of the invention, a wavelength encoded fiber optic sensor and method is provided which comprises means for generating a magnetic field which can be varied by a physical parameter, a magnetizable thin film which forms a phase grating which is a function of the magnetic field, and means for irradiating the grating with light to diffract light from the grating having a characteristic which corresponds to the physical parameter.

These and other aspects and advantages of the present invention will be readily appreciated upon reading the detailed description with reference to the accompanying drawings.

BRIEF DESCRIPTION OF THE DRAWINGS

FIG. 1 is a representative plot of intensities I of different wavelengths at a given magnetic field B strength for an apparatus according to the present invention;

FIG. 2 illustrates schematically an embodiment of an optical spectrum analyzer in accordance with the present invention;

FIG. 3 illustrates schematically another embodiment of an optical spectrum analyzer in accordance with the present invention;

FIG. 4 illustrates schematically an optical spectrum analyzer in combination with multiple fiber optic sensors in accordance with the present invention;

DESCRIPTION OF PREFERRED AND ALTERNATIVE EMBODIMENTS

Figure 5:
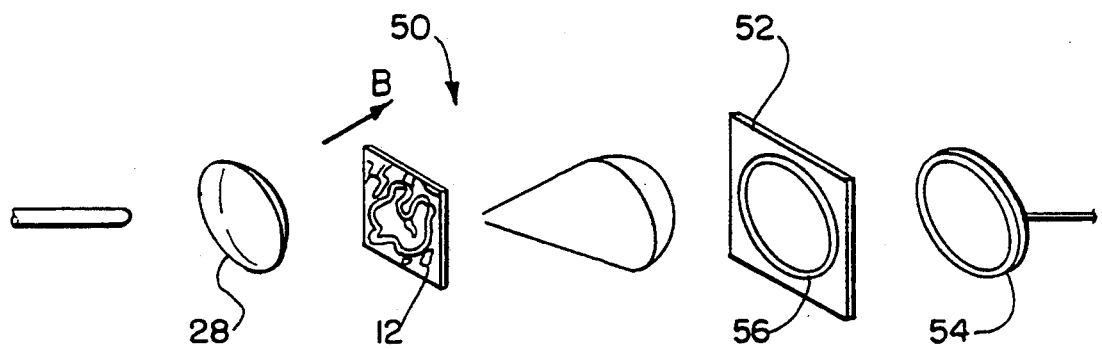
FIG. 5 illustrates an embodiment of an optical spectrum analyzer which analyzes non-polarized light.

Thin-film magnetic diffraction gratings, e.g., having a layer of bismuth substituted rare earth iron garnet, exhibit certain properties that affect electromagnetic radiation propagating through the material in the presence of a magnetic field. Under the influence of an in-plane applied magnetic field, such films have a striped domain structure which forms a phase grating. The striped domain spacing or grating period s, and the resultant angle of diffraction $\theta$, can be altered by varying the applied magnetic field B. When the film is influenced by zen magnetic field or a transverse magnetic field, the domains are random (usually serpentine) but their spacing is still a function of the strength of the magnetic field. The term "thin-film magnetic material" refers in the broadest sense to any material or film having magnetically responsive domains that exhibit the Faraday rotation effect. Thin-film magnetic material exhibits magnetized domain boundaries which form a phase grating and in which each domain exhibits a Faraday rotation. More specifically, the invention is preferably used with a magneto-optic material or film that is characterized by being sufficiently thin to exhibit a phase grating effect and also in which each domain exhibits a substantial Faraday rotation. Such films are commercially available, such as materials A, and B manufactured by Mitsubishi Gas Chemical America, Inc., and Garnet LPE film manufactured by Tokin America, Inc. but the invention is not limited to use of these films only.

Light incident on the phase grating undergoes both a diffraction effect and the polarization rotation effect, i.e., rotation of the plane of polarization of the light. In accordance with the present invention, the use of such gratings in spectral analysis involves a spectral signal incident upon the grating within the bounds of a controlled magnetic field. For stripe domain gratings, the spectral signal is diffracted in a first order at an angle $\theta$ to a photodetector (see FIG. 2). The wavelength of the diffracted spectral component incident upon the photodetector is given by EQ. 1

$$\lambda = s \sin \theta$$

where s is the grating period. By controlling the magnetic field in a known manner, the grating period s is dependent upon the applied magnetic field B so that EQ. 2

$$\lambda = s(B) \sin \theta$$

where s(B) represents the definable functional relationship between the grating period s and the magnetic field B.

A typical measurement of I (detected intensity) verses B (magnetic field) for the photodetector that senses the diffracted light (FIG. 2) is shown in FIG. 1, for a spectral signal incident on the grating of FIG. 2. As the magnetic field is varied, the grating period also varies, so that different wavelengths of light are diffracted at the angle $\theta$ to the photodetector 20. The detected intensity I of the diffracted light (as a function of the strength of magnetic field B) can thus be converted to a corresponding wavelength since the relationship between B and $\lambda$ depends upon the grating equation, the angle of diffraction $\theta$, and the known relationship of the grating period s as a function of the strength of magnetic field B. As illustrated by the plot of FIG. 1, at a given strength of magnetic field B, different wavelengths of diffracted light produce peak intensities I at the photodetector that is spatially fixed at an angle $\theta$. By corresponding intensities for known magnetic field strength, a spectral analyzer can be calibrated to electronically identify wavelengths of a spectral signal.

With reference to FIG. 2, one embodiment of a spectral analyzer 10 is illustrated in a simplified manner for clarity wherein a magnetizable thin-film 12 having planar surfaces is provided. A variable magnetic field B is applied to the film 12 in a direction generally parallel to the planar surfaces as indicated to produce a stripped domain phase grating having a grating period s. The magnetic field can be produced in a conventional manner, such as for example, flowing current through a series of coils. A preferably collimated spectral signal 14 with unknown wavelengths is directed to be generally orthogonally incident upon a planar surface of the grating through a polarizer 16 that is parallel to the planar surfaces of the grating. Through a symmetrically opposite polarizer 18 a first order of the incident light is diffracted at an angle $\theta$ to a photodetector 20 connected to a signal processing means 22. The spectral signal 14 can be broadband range or of a selected narrow range. The use of polarizers, though not critical to practice of the invention, has been discovered to improve the contrast of different wavelengths of light diffracted by the grating. For each selected strength of magnetic field B that defines a specific grating period s, spectral signal 14 is diffracted in a first order at angle $\theta$ to photodetector 20. The photodetector converts the incidental diffracted light to electrical signals which represent the intensity I of the incident light. The intensity I signal from the photodetector 20 is sent to the signal processing means 22 and correlated to the known current i used to produce the given magnetic field strength. The intensity versus magnetic field data is then converted to wavelength data by use, for example, of a look-up table stored in a memory that stores the calibration data of wavelengths diffracted at different magnetic field strengths.

FIG. 3 illustrates an embodiment of a sensor de-multiplexer 24 which uses the above described method of intensity/wavelength detection to determine component wavelengths of detected light. The sensor 24 includes a planar thin-film magnetizable grating 12 with a pair of polarizers 16 and 18 positioned parallel at opposite planar sides of the grating. Incident light is guided by an optical fiber 26 though a collimating lens 28. Electro-magnets 30 are positioned proximate to the grating 12 to create a magnetic field which is generally parallel to the planar surfaces of the grating. Electric current to the electro-magnets 30 is controlled via current supply lines 32 from the signal processing and control means 34. Light diffracted from the grating at an angle $\theta$ passes through an aperture 36 to a photodetector 38 which is connected to the signal processing and control means 34. As described above, as the magnetic field B strength is varied, light is diffracted by the grating 12 in a first order at angle $\theta$ as a function of the wavelength content of the input spectral signal. The diffracted light passes through the aperture 36 to the photodetector 38 which detects intensity of the incident diffracted light and converts the light to an electrical signal. The photodetector output is received by the signal processing means 34 and compared to the known current i to electromagnets 30 and matched to calibrated values for wavelengths diffracted at given magnetic field B strength to determine the wavelength(s) of the diffracted light.

The exemplary optical spectrum analyzer described with reference to FIG. 3 can be used to de-multiplex signals from a multiple wavelength encoded sensor array as illustrated in FIG. 4. Each of an array of multiple fiber optic sensors 40, for example, produces a narrow band optical signal within a portion of the broad band source spectrum of optical source 42 coupled to fiber optic sensors 40 by multi-mode optical fiber 44. The output of multiple fiber optic sensors 40 is again coupled to a single multi-mode optical fiber 46 and collimated for input into a spectrum analyzer 48 such as the analyzer of FIG. 3. The position of the narrow band signal of each of the fiber optic sensors 40 provides a measure of a sensed parameter such as described hereinafter with reference to FIG. 6. Such an embodiment further advantageously provides simultaneous detection and processing of the signals of each of the array of multiple fiber optic sensors 40.

FIG. 5 illustrates another embodiment of a spectral analyzer 50 in which a variable magnetic field B is applied transverse to the plane of the grating 12 to produce annular rings of diffracted light. Because the magnetic field is transverse to the plane of the film, the magnetic domains are random and tend to have a serpentine configuration. This causes a conical diffraction pattern and diffraction occurs without the need to use a polarizer. The arrangement of analyzer 50 is similar to that shown in FIG. 3 with the addition of a spatial filter 52 which is positioned between grating 12 and a large area photodetector 54. As noted, a magnetic field B is applied transverse to the plane of grating 12. Light focused by lens 28 is incident upon grating 12 and is diffracted in a conical diffraction pattern into the spatial filter 52 having an annular opening 56 to allow light to pass to a large area photodetector 54. In this embodiment, small changes in the magnetic field applied transverse the plane of the grating result in corresponding changes in the radius of diffracted light for a given wavelength. The magnetic field can also be modulated at low levels to modulate the wavelength transmitted through annular openings of spatial filter 52. Wavelengths of detected light are determined by this embodiment in a manner similar to that previously described wherein the intensity of an order of light diffracted by grating 12 through opening 56 in spatial filter 52 is detected by photodetector 54 connected to signal processing means which matches a detected intensity value and magnetic field value to calibrated values of wavelengths to magnetic field strength.

According to another aspect of the present invention, a wavelength-encoded optic sensor is provided which produces diffracted light from a Faraday grating at an angle and wavelength determined by a physical influence on a magnetic circuit which generates a magnetic field about the grating. The wavelength of light diffracted by the grating as a function of the grating period is defined by the basic grating-equation of EQ. 3

$$s [\sin \theta_i + \sin \theta_d] = m\lambda$$

where s is the grating period, $\theta_i$ is the angle of incidence, $\theta_d$ is the diffraction angle, m is the order of the diffraction, and $\lambda$ is the wavelength of the diffracted light. If $\theta_i = \theta_d$, and m=1, then EQ. 4

$$s = \frac{\lambda}{2\sin\theta}$$

For a striped domain phase grating, the grating period can be modified by changing the magnitude of an applied in-plane magnetic field B. If the magnetic field is then modulated according to a physical parameter of interest, P, and the relationship between s and B, and B and P are known, the parameter of interest can be extracted from a simple measurement of the wavelength $\lambda$ of the diffracted light. In this case EQ. 5

$$s = s(B) = s(B[P]) = s[P]$$

where S(B) represents the dependence of the grating period S upon the magnetic field B, and B[P] represents the influence on the magnetic field B by the parameter P so that EQ. 6

$$P = s^{-1}\left[\frac{\lambda}{2\sin\theta}\right]$$

Equation 6 demonstrates that a physical parameter can be transduced into a wavelength encoded optical signal as a function of a modulated grating period under control of a corresponding modulated magnetic field.

Figure 6:
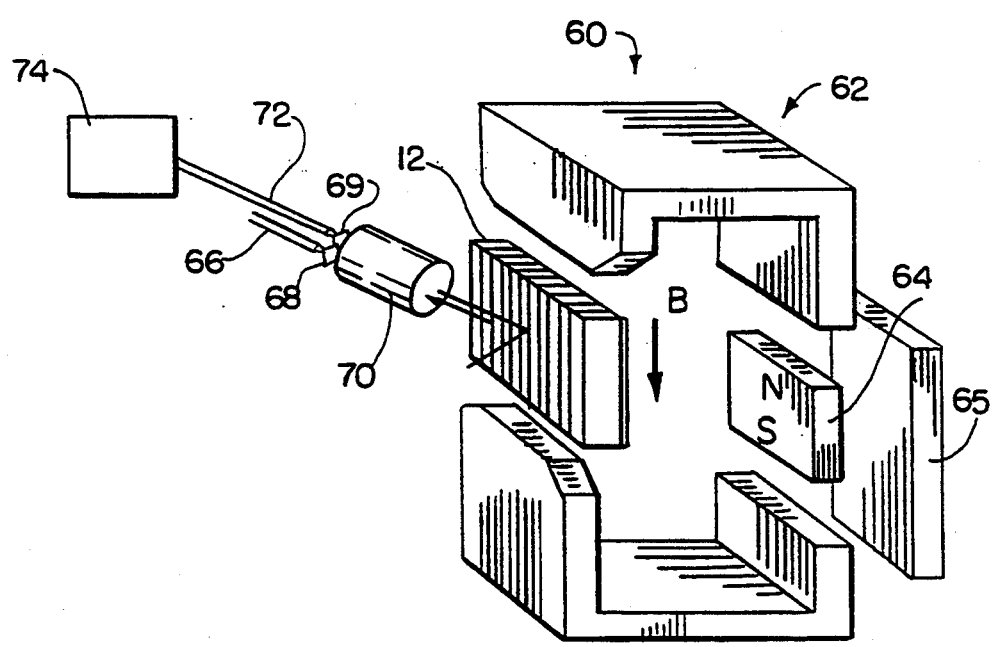
FIG. 6 illustrates schematically an embodiment of a wavelength encoded fiber optic sensor in accordance with the present invention.

With reference to FIG. 6, an example of a wavelength-encoded optical sensor 60 which operates on the above-described principles is shown. The sensor 60 includes a magnetic circuit 62 positioned proximately about a thin-film phase grating 12 such that an in-plane magnetic field B can be applied parallel to the planar surfaces of the grating 12. The magnetic circuit 62 includes a permanent magnet 64 upon which a parameter of interest, represented schematically by the body 65, exerts a magnetic influence, thereby changing the strength of the magnetic field B, the spacing of the striped domains of the grating, and thus resultant angle of diffraction of incident light. The grating 12 is radiated with a light source directed by an input optical fiber 66 through a polarizer 68 and lens 70. Light diffracted by the grating is received by the lens 70 then through an analyzer 69 and into a parallel arrangement to an output optical fiber 72 for further processing 74. In such an embodiment, light from a broadband optical source is transmitted by the optical fiber 66 through the polarizer 68 and the collimating lens 70 and is incident upon grating 12 at an angle chosen such that the first order of diffracted light returns through lens 70, through a second polarizer 69 and is optically coupled into output the fiber 72 for transmittal to a processor 74. The wavelength of the diffracted narrowband signal allows the processor, such as a spectral analyzer according to the present invention, to determine the magnitude of the parameter of interest according to Equation 6.

With continuing reference to FIG. 6, a more specific example of use of such a wavelength encoded optical sensor is as a position or proximity sensor of a ferromagnetic object represented schematically by body 65. With body 65 at a distance $d_1$ from permanent circuit magnet 64, the corresponding magnetic field B is of a strength to produce a grating period $s_1$ of grating 12 resulting in a diffracted wavelength $\lambda_1$ at an angle of diffraction $\theta$ of incident light. When the body 65 is in a second position at a distance $d_2$, the ferro-magnetic influence of the body 65 upon the permanent magnet 64 changes the strength of magnetic field B about grating 12 to produce a second grating period $s_2$ that results in a diffracted wavelength $\lambda_2$ at the angle of diffraction $\theta$. The wavelength of light diffracted at angle $\theta$ can be determined by the processor 74 such as a spectral analyzer to determine the magnitude or characteristic of the parameter of interest by Equation 6.

As a sensor, the invention of course is not limited to the specific embodiment of FIG. 6. Some alternative variations and applications include operation of the sensor in a transmissive rather than a reflective mode; utilization of a moving magnet as a parameter of interest represented by the body 65; and utilization of the sensor to detect variable magnetic fields without the use of a permanent magnet 64 in the magnetic circuit 62. Additional features and advantages of the invention embodied as a sensor include wavelength encoding, relative immunity to optical source fluctuations, and the ability to sense any physical parameter that can modulate a magnetic field to affect the grating period. A noninclusive list of some the parameters measurable by the present invention includes; magnetic fields, electric fields, linear displacement, rotary displacement, pressure, stress, strain and temperature.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

I claim:

1. An optical wavelength detector for detecting multiple wavelengths of a spectral signal, said detector comprising:
    means for varying a magnetic field;
    a diffraction grating having a grating period which is a function of said magnetic field; and
    means for radiating said grating with the spectral signal as said magnetic field is varied, said grating diffracting respective wavelengths of the spectral signal as a function of said variable magnetic field.

2. The detector of claim 1 wherein said magnetic field is applied to said grating in a direction parallel to a planar surface of said grating.

3. The detector of claim 1 further including means for detecting a portion of said spectral signal diffracted by said grating.

4. The detector of claim 3 wherein said means for detecting is positioned at a fixed angle relative to said grating.

5. The detector of claim 1 wherein the strength of said magnetic field is varied in a predetermined manner.

6. The detector of claim 1 wherein said spectral signal is radiated on said grating by optical fiber means.

7. The detector of claim 1 further including polarizers positioned generally parallel to opposite planar surfaces of said grating and a colliminating lens between the spectral signal input and said grating.

8. The detector of claim 3 wherein said means for detecting a portion of said spectral signal comprises a photoelectric device.

9. The detector of claim 8 wherein said photoelectric device is connected to signal processing and control means for comparing detected values of diffracted signal intensity with values of current flow to said means for generating said magnetic field.

10. The detector of claim 9 wherein said signal processing and control means variably controls said applied magnetic field about said grating to vary the grating period.

11. The detector of claim 9 further including multiple spectral signal inputs to said detector and a de-multiplexer circuit to receive an output signal from said signal processing means corresponding to each of said spectral signal inputs.

12. A wavelength encoded sensor comprising,
    means for generating a magnetic field which can be varied by a physical parameter,
    a magnetizable thin film which forms a phase grating which is a function of said magnetic field, and
    means for irradiating said grating with multiple wavelength light so that light diffracted by said grating has wavelength characteristics which correspond to said physical parameter.

13. The sensor of claim 12 wherein said magnetic field is generated in a direction parallel to a planar surface of said grating.

14. The sensor of claim 12 wherein said magnetic field about said grating is provided by a magnetic circuit having at least one permanent magnet.

15. The sensor of claim 12 wherein said means for irradiating said grating further includes at least one optical fiber and polarizer and lens.

16. The sensor of claim 12 further including means for detecting light diffracted from said grating.

17. The apparatus of claim 12 further comprising a wavelength detector for detecting the sensor diffracted light output, said wavelength detector comprising a second phase grating that diffracts the sensor output light wavelengths as a function of a variable magnetic field applied to said second grating.

18. A method of spectral wavelength analysis comprising the steps of:
    producing a variable magnetic field about a magnetizable grating to form a diffraction grating having a period that is a function of said magnetic field;
    irradiating said grating with a multiple wavelength spectral signal and diffracting different wavelengths as a function of said grating period; and
    detecting a portion of said diffracted light.

19. The method of claim 18 further including the step of comparing detected intensities of said diffracted light to said variable magnetic field.

20. The method of claim 18 further including the step of generating said magnetic field in a direction parallel to a planar surface of said grating.

21. The method of claim 18 further including the step of positioning polarizers parallel to opposite planar surfaces of said grating and orthogonal to the angle of incidence of said spectral signal.

22. A method of sensing a physical parameter comprising the steps of,
    generating a magnetic field about a thin-film magnetizable grating to form a grating period which is a function of said magnetic field;
    irradiating said grating with a multiple wavelength spectral signal to produce a wavelength-dependent diffraction pattern; and
    varying said magnetic field in response to a physical parameter such that said diffraction pattern wavelengths correspond to said parameter.

23. The method of claim 22 wherein said magnetic field about said grating is generated by a magnetic circuit having a permanent magnet.

24. The method of claim 23 wherein said physical parameter modulates said permanent magnet flux.

25. The method of claim 22 further including the step of radiating said grating with a broadband spectral signal from at least one optical fiber.

26. The method of claim 22 further including the step of receiving light diffracted from said grating.

27. The method of claim 26 further including the step of detecting light diffracted from said grating by a photoelectric device.

28. Apparatus for processing wavelength encoded optical signals comprising:
    a variable magnetic field applied to a diffraction grating having a grating period that is a function of said magnetic field;
    a source of light having a number of wavelengths incident upon said grating; and
    means for receiving light diffracted by said grating;
    wherein said diffracted light exhibits a relationship between wavelengths of said diffracted light and said variable magnetic field.

29. Apparatus according to claim 28 wherein said apparatus is used as a spectrum analyzer.

30. Apparatus according to claim 29 wherein said apparatus is used as a wavelength encoding sensor.

31. The apparatus of claim 28 wherein said diffracted light is unpolarized.

32. The apparatus of claim 28 wherein the diffracted light is detected at a fixed diffraction angle relative to an angle of incidence of the light on the grating.

* * * * *